United States Patent [19]

Lillis

[11] Patent Number: 4,542,368
[45] Date of Patent: Sep. 17, 1985

[54] TRIMMABLE RESISTIVE SCALING NETWORK SUITABLE FOR DIGITAL TO ANALOG CONVERTERS

[75] Inventor: William J. Lillis, Tucson, Ariz.

[73] Assignee: Burr-Brown Corporation, Tucson, Ariz.

[21] Appl. No.: 351,501

[22] Filed: Feb. 23, 1982

[51] Int. Cl.[4] ............................................. H03K 13/02
[52] U.S. Cl. ...................... 340/347 CC; 340/347 DA; 340/347 M
[58] Field of Search ................. 340/347 CC, 347 DA, 340/347 M

[56] References Cited

U.S. PATENT DOCUMENTS 4,338,592 7/1982 Wilensky ........................ 340/347 M

OTHER PUBLICATIONS

Terman RADIO ENGINEERS' HANDBOOK, McGraw-Hill Book Co., Inc., 1943, pp. 215-217.

Primary Examiner—T. J. Sloyan
Attorney, Agent, or Firm—Weiss & Holloway

[57] ABSTRACT

A trimmable resistive scaling network suitable for use in digital-to-analog converters or the like. At least two trimmable resistors with low order integral relative values provide for either scaling up or scaling down with high accuracy.

8 Claims, 3 Drawing Figures

TRIMMABLE RESISTIVE SCALING NETWORK SUITABLE FOR DIGITAL TO ANALOG CONVERTERS

CROSS REFERENCE TO RELATED APPLICATION

This application is related to the copending application entitled "A Circuit for Improving the Performance of Digital-to-Analog Converters," filed on even dated herewith. This patent application has a Ser. No. 351,542.

BACKGROUND OF THE INVENTION

1. Field of the Invention

This invention relates generally to an improved resistive dividing or scaling network which may be trimmed to achieve either higher or lower scaling factors and more specifically, to a resistive dividing network useful in scaling the relative combinations of the higher and lower order bits in a digital to analog converter (DAC hereinafter).

2. Description of the Prior Art

In the past, integrated circuit DAC's have been configured with the higher order bits binarily divided in a main ladder and the lower order bits binarily divided in an output R-2R ladder. The bits are summed at an output node, such as shown in FIG. 1, where $I_1$, $I_2$ and $I_3$ represent the higher order bit currents and $I_4$-$I_7$ (and higher-not shown) represent equal current sources which are binarily divided in the R-2R ladder sequence shown in FIG. 1. The current sources $I_1$-$I_7$ . . . are understood to be toggled by digitally-controlled bit switches (not shown).

Initially, the circuit is adjusted by a trim to set the $I_1/I_2/I_3$ ratio as well as by an independent trim so that current sources $I_4$-$I_7$ . . . make binary contributions at the output. Such a procedure may often result in an incorrect ratio between the higher order bits $I_1$-$I_3$ and the lower order bits $I_4$-$I_7$ . . .

The lower order bit outputs usually are divided or scaled before summation with the higher order bits. A trimmable scaling or dividing network can be used to divide the entire output of the R-2R ladder without changing the binary division accomplished within the output ladder. The utility of this technique is severely limited if the trimming method (which conventionally adjusts resistor values upward) can only increase or only decrease the relative contribution of the lower order bits with respect to the higher order bits.

In the past, it was possible to build a DAC without using a R-2R ladder network by incorporating a quad current switch approach. In a quad current switch, four current sources and switches would be grouped together, with their currents scaled at a ratio of 8:4:2:1. In a 16-bit DAC, for example, there would be four quad current switches. The output of the first quad current switch would be coupled directly to the DAC output. The second quad current switch output would be divided by 16, the third quad current switch output would be divided by 256, and the fourth quad current switch would be divided by 4096. The dividing network used to scale the respective quad current switches was comprised of a pair of resistors and was usually trimmable both up and down. For example, between the first and second quad current switches, the dividing circuit would be comprised of a first trimmable resistor of value R and second trimmable resistor of value 15R, so as to achieve the 16:1 ratio between the first and second quad current switches. Between the second and third quad current switches, the dividing circuit was comprised of trimmable resistors having respective values R and 255R. Between the third and fourth quad current switches, the dividing circuit networks was comprised of trimmable resistors having a ratio of R to 4095R.

The trimmable resistors in the dividing circuits were difficult to build in the ratios of 1:15, 1:255 and 1:4095, and would change with age. In addition it was very difficult to trim the resistors (up and down) to get accurate sensitivity and resolution. As a result, the quad current switch approach has been supplanted by the R-2R ladder network. However a need existed to provide, for modern DACs incorporating R-2R ladder networks, a trimmable scaling or dividing network which both maintains the desired circuit impedance levels, allows independent trimming of the bit ratios, and can be trimmed to effect a relative increase or decrease of the lower order bit contribution at the output.

SUMMARY OF THE INVENTION

In accordance with one embodiment of this invention, it is an object of this invention to provide an improved dividing network for a DAC.

It is another object of this invention to provide an improved dividing network for a DAC that allows the contribution of the lower order bits to be adjusted up or down with respect to the contribution of the higher order bits.

It is yet a further object of this invention to provide a simple scaling network for a DAC wherein the nominal values of the resistive components lie in a simple integral relation to the resistor values in the R-2R ladder.

It is still another object of this invention to provide an improved scaling network wherein the trimmable resistors are configured for a match of their required resolution and range capabilities.

DESCRIPTION OF THE PREFERRED EMBODIMENTS

In accordance with one embodiment of this invention, a trimmable resistive scaling network suitable for use in a DAC and having the capability for either reducing or enhancing the signal contributed by the lower order bits is disclosed. In accordance with a more particular embodiment of the invention, there is disclosed a trimmable scaling network for a DAC wherein the trimmable resistors are configured for a match of their required resolution and range capabilities.

DETAILED DESCRIPTION OF THE DRAWINGS

Figure 1:
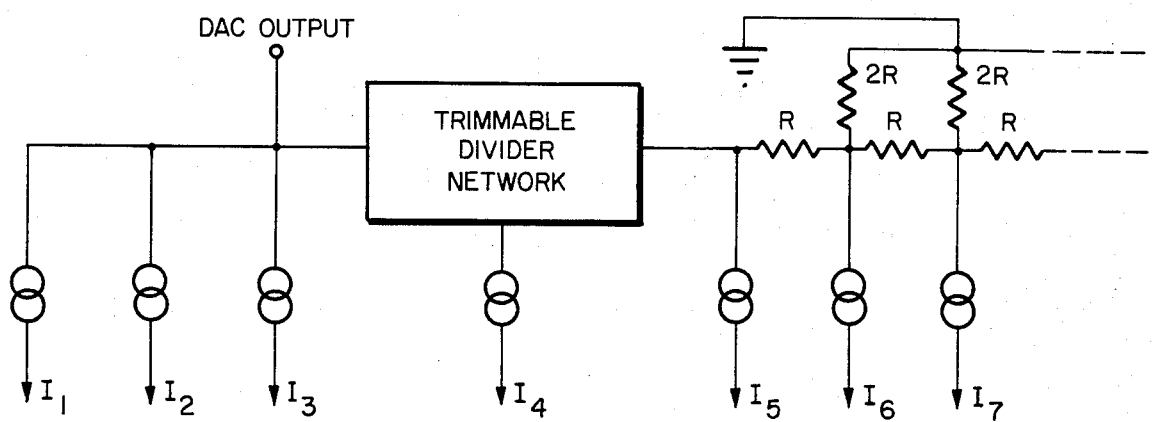
FIG. 1 is illustrative of a trimmable divider or scaler network for matching the relative contributions of higher order bits represented by $I_1$-$I_3$ and lower order bits $I_4$-$I_7$ . . .
Figure 2:
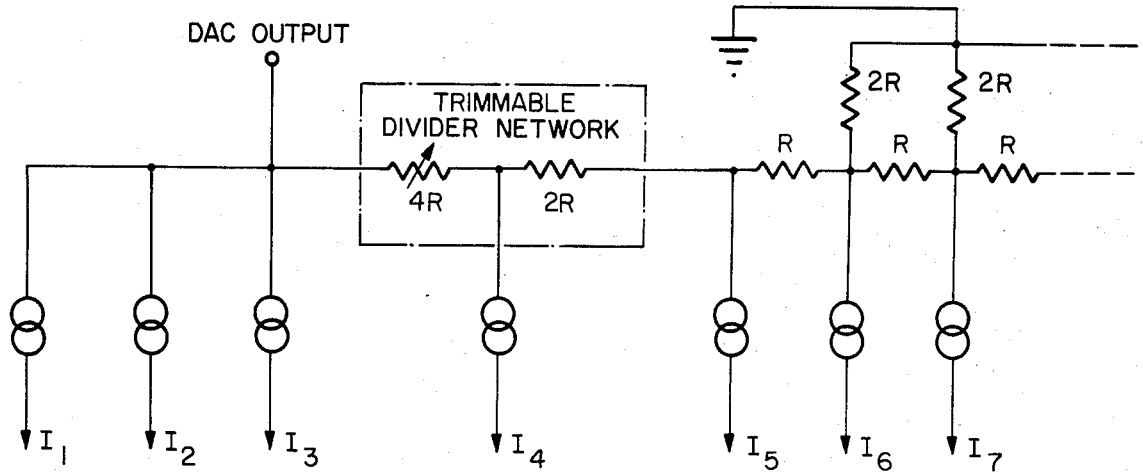
FIG. 2 shows details of a divider or scaler network with one trimmable resistor which can reduce the relative contribution of the lower order bits.

With reference to FIG. 2, the trimmable resistor 4R in combination with fixed resistor 2R as components of the divider network serve to binarily scale approximately selected current sources $I_1-I_7$ ... at the output node as well as to reduce the relative contribution of the lower order bits by a trim of the resistor 4R which increases its value. Because resistor 4R may only be increased in value by conventional trim techniques, its initial or nominal value must be less than 4R (relative to the resistor values in the R–2R ladder) by an amount which is roughly twice the expected tolerances in the nominal matches of the ladder resistors. This means that fairly large adjustments in the nominal 4R resistor will be required even in the case where all the resistive components lie exactly on the design center.

Figure 3:
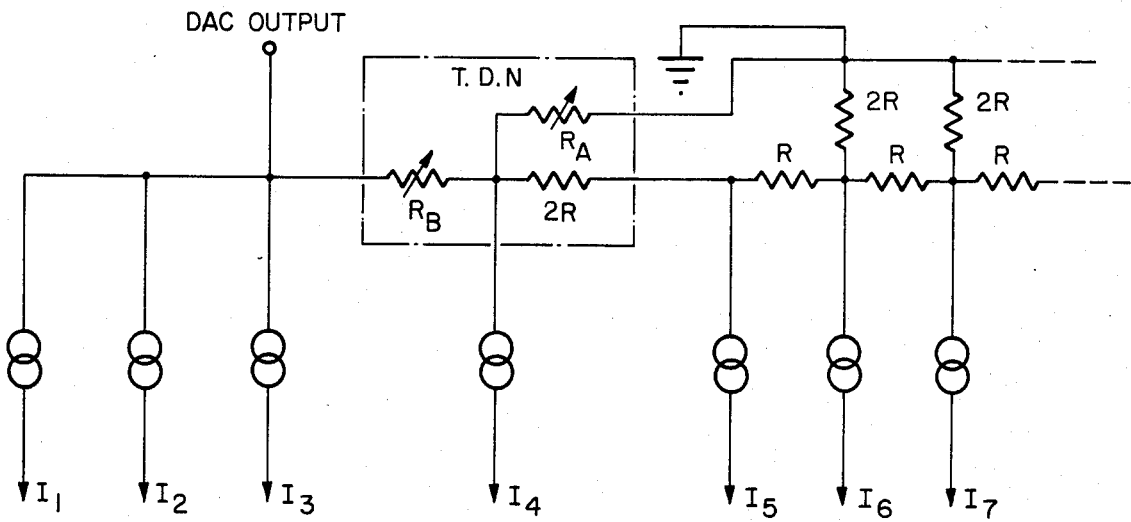
FIG. 3 illustrates a trimmable divider or scaler network comprising two trimmable resistors which may be adjusted to either increase or decrease the relative contribution of the lower order bits.

One way to overcome this disadvantage is shown by the embodiment of FIG. 3. Here a first trimmable resistor $R_A$ shunts a portion of the bit currents $I_4-I_7$ ... to ground while trimmable resistor $R_B$ partially determines the fraction of the lower order bit currents which will be summed at the output. The trimmable scaling network also comprises a third resistor having a nominal value 2R, i.e. the same as the resistors connected to ground in the R–2R ladder which binarily divides the lower order bit current sources. Since the impedance looking to the right from the $I_5$ node is 2R, the fixed resistor in the trimmable network must have the same value in order to make the contribution of $I_4$ at the output twice as great as equal current source $I_5$.

Trimmable resistors $R_A$ and $R_B$ may take on a range of nominal discrete complementary values as shown in the following table:

| $R_A/R$ | $R_B/R$ |
|---|---|
| ½ | 4/9 |
| 3/2 | 12/11 |
| 2 | 4/3 |
| 3 | 12/7 |
| 4 | 2 |
| infinity | 4 |

The values of $R_A$ and $R_B$ above are normalized by the nominal value of the resistors R in the R–2R ladder. The last case corresponds to the situation of FIG. 2 with the disadvantages hereinbefore, of the other possible choices, the pair $R_A/R=4$ and $R_B/R=2$ are the best for monolithic integration because the resulting values are low-order integral multiples both mutually and with respect to the resistors in the R–2R ladder. Thus the geometric layout of the resistors is simplified in that the lengths of the resistors may be simply doubled or quadrupled with a high confidence level of achieving the desired nominal ratios.

It may be shown in general (for the complementary pairs of values of $R_A$ and $R_B$ above) that the output current is invariant when the following trim ratio is achieved:

$$\frac{\text{output change for percent change in } R_B}{\text{output change for percent change in } R_A} = -\left[1 + \frac{R_A}{4R}\right]$$

Thus for the case where $R_A=4R$, the trim sensitivity to $R_B$ is opposite to and twice as great as that for $R_A$. Thus the trim tab on $R_B$ is desirably designed for twice the resolution and half the range (percent) as that on $R_A$. This may be simply accomplished in the case $R_A/R=4$, $R_B/R=2$ by providing a fixed (untrimmed) portion of $R_B$ with a value of R and a trimmed portion of value R of identical configuration to each of four unit resistors in $R_A$, so that both $R_A$ and $R_B$ have equal absolute trim effects on the output.

While the invention has been particularly described with reference to preferred embodiments thereof, it will be understood by those skilled in the art that the foregoing and other changes in form and details may be made therein without departing from the spirit and scope of the invention. For example, trimmable resistive scaling networks in accordance with the foregoing teaching may be used to set the ratios between more than two subjects of current sources and/or for applications other than DAC devices.

What is claimed is:

1. A digital to analog converter comprising:
    a first plurality of current source means, each of said first plurality of current source means for providing a predetermined current contribution in response to a control signal from said digital to analog converter;
    a second plurality of current source means, each of said second plurality of current source means providing a predetermined current contribution in response to control signals;
    a R–2R resistance network coupled to a common terminal and having a group of said second plurality of current source means coupled to nodes of said R–2R resistance network;
    a first controllable resistor means coupled between an output terminal of said digital to analog converter and said R–2R resistor network, said first controllable resistor means including a controllable resistor and a fixed resistor, wherein a one of said second plurality of current sources is coupled to said output terminal of said digital to analog converter through said controllable resistor and to said R–2R resistor network through said fixed resistor, said first controllable resistor means for adjusting relative current contribution of said one and said second plurality of current source means provided to said digital to analog output terminal.

2. The digital analog converter of claim 1 further comprising a second controllable resistor, said first and said second controllable resistors for adjusting relative current contributions of said one and said group of second plurality of current sources provided to said digital to analog output terminal.

3. The digital to analog converter of claim 1 wherein said controllable resistor and said fixed resistor have values in a ratio of substantially two to one.

4. The ditital to analog converter of claim 1 wherein said first controllable resistor means can adjust said relative current contributions of said one and said second plurality of current source means to a predetermined ratio.

5. The digital to analog converter of claim 2 wherein said first and said second controllable resistors have substantially equal absolute true values.

6. The digital to analog converter of claim 2 wherein each of said controllable resistor and said fixed resistor have a substantially two to one resistance ratio with one of the resistors in said R–2R ladder.

7. A digital to analog converter comprising:

a first plurality current source means coupled to an output terminal of said digital to analog converter, said first plurality of current source means for providing pre-determined current contributions to said output terminal in response to control signals;

a R-2R resistor network;

a scaling network means coupling said R-2R resistor network to said output terminal;

a second plurality of current source means, a one of said second plurality of current source means coupled to said scaling network, others of said second plurality of current source means coupled to nodes of said R-2R resistor network, wherein component values of said R-2R network and said scaling network means determine current contributions to said output terminals by said second plurality of current source means when selected ones of said second plurality of current source means are activated by control signals;

said scaling network means including a fixed resistor coupling said R-2R resistor network to said one of said second plurality of current source means; and a first trimmable resistor means coupling said one of said second current sources to said output terminal, said first trimmable resistor means for adjusting current contributions by said second plurality of current source means to said output terminal.

8. The digital to analog coverter of claim 7 wherein said scaling network means is further comprised of a second trimmable resistor means coupled between said one of said second plurality of current source means and a common converter terminal, said first and said second trimmable resistor means for adjusting current contributions of said second plurality of current source means to said output terminal.

* * * * *